United States Patent
Song et al.

(10) Patent No.: US 9,246,136 B2
(45) Date of Patent: Jan. 26, 2016

(54) ARRAY SUBSTRATE AND MANUFACTURING METHOD THEREOF

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/103,617

(22) Filed: Dec. 11, 2013

(65) Prior Publication Data

US 2014/0159020 A1 Jun. 12, 2014

(30) Foreign Application Priority Data

Dec. 12, 2012 (CN) .......................... 2012 1 0537767

(51) Int. Cl.
*H01L 21/00* (2006.01)
*H01L 51/56* (2006.01)
*H01L 51/52* (2006.01)
*H01L 27/32* (2006.01)

(52) U.S. Cl.
CPC .............. *H01L 51/56* (2013.01); *H01L 27/322* (2013.01); *H01L 27/3206* (2013.01); *H01L 27/3244* (2013.01); *H01L 51/5265* (2013.01)

(58) Field of Classification Search
CPC . H01L 51/0545; H01L 27/1214; H01L 27/12; H01L 33/0079; B82Y 10/00
USPC ........................ 257/40, 59; 438/22, 28, 29, 34
See application file for complete search history.

(56) References Cited

U.S. PATENT DOCUMENTS

| | | | |
|---|---|---|---|
| 2005/0140277 A1* | 6/2005 | Suzuki et al. | 313/504 |
| 2006/0152151 A1* | 7/2006 | Seo | H01L 27/322 |
| | | | 313/506 |
| 2006/0232195 A1* | 10/2006 | Cok et al. | 313/504 |

(Continued)

FOREIGN PATENT DOCUMENTS

| CN | 202957247 U | 5/2013 |
|---|---|---|
| JP | 2010010020 A | 1/2010 |

(Continued)

OTHER PUBLICATIONS

English abstract of JP 2010287543A, 2 pages.
(Continued)

*Primary Examiner* — Lex Malsawma
*Assistant Examiner* — Eric Jones
(74) *Attorney, Agent, or Firm* — Ladas & Parry LLP

(57) ABSTRACT

Embodiments of the present invention disclose a method for manufacturing an array substrate comprising: forming patterns of a thin film transistor structure and a passivation layer on a base substrate to define a plurality of pixel units on the base substrate; forming subsequently patterns of a transflective layer and a color filter in a pixel region of the pixel unit, the color filter being disposed above the transflective layer; forming an organic light-emitting diode in the pixel region of the pixel unit so that the transflective layer and the color filter are disposed between the organic light-emitting diode and the thin film transistor structure. Embodiments of the present invention also provide an array substrate.

10 Claims, 4 Drawing Sheets

(56) References Cited

U.S. PATENT DOCUMENTS

| | | | |
|---|---|---|---|
| 2009/0021676 A1* | 1/2009 | Kuo et al. | 349/114 |
| 2009/0251051 A1 | 10/2009 | Hwang et al. | |
| 2010/0001637 A1 | 1/2010 | Satou | |
| 2010/0090594 A1* | 4/2010 | Choi et al. | 313/506 |

FOREIGN PATENT DOCUMENTS

| | | |
|---|---|---|
| JP | 2010117398 A | 5/2010 |
| JP | 2010287543 A | 12/2010 |

OTHER PUBLICATIONS

English abstract of JP 2010010020A, 2 pages.
Extended European search report for international application No. 13196858.8 issued by the European Patent Office on Mar. 7, 2014, 51 pages.
First Office Action (Chinese language) issued by the State Intellectual Property Office ("SIPO") on Apr. 28, 2014 for application No. CN 201210537767.9, 4 pages.
English translation of first Office Action for patent application No. CN 201210537767.9, 3 pages.
Chinese Rejection Decision dated Apr. 23, 2015; Appln. No. 201210537767.9.
Second Office Action for Chinese Patent Application No. 201210536963.4 dated Mar. 25, 2015; four (4) pages.
English translation of Second Office Action for Chinese Patent Application No. 201210536963.4 dated Mar. 25, 2015; three (3) pages.
Extended European search report issued on Mar. 7, 2014 by the European Patent Office for international application No. 13196856.2, fifty-one (51) pages.
Office Action for U.S. Appl. No. 14/101,735 dated Feb. 23, 2015; thirty-seven (37) pages.
First Office Action for Chinese Patent Application No. 201210536963.4 dated Oct. 31, 2014; nine (9) pages.
English translation of First Office Action for Chinese Patent Application No. 201210536963.4 dated Oct. 31, 2014; nine (9) pages.
English abstract for JP2010287543A, two (2) pages, 2010.
English abstract for CN202957247U, one (1) page, 2013.
English translation for JP2010117398A, twenty-nine (29) pages, 2010.

* cited by examiner

ARRAY SUBSTRATE AND MANUFACTURING METHOD THEREOF

CROSS REFERENCE TO RELATED APPLICATIONS

This application claims priority from Chinese National Application No. 201210537767.9 filed on Dec. 12, 2012, the contents of which are incorporated herein by reference.

TECHNICAL FIELD

Embodiments of the present invention relate to a technology field of display, particularly relate to an array substrate and a method for manufacturing the same.

BACKGROUND

An Organic Light-Emitting Diodes (OLED) is considered as one of the most promising display technologies in the future for its advantages in simple manufacturing process, low cost, the ability adjustable color of its emitting light in the region of visible light, suitable for manufacturing a large size display device and the flexible and the like. Especially the white OLED (WOLED) has a power efficiency over 60 lm/W and a lifetime of more than 20,000 hours, greatly promoting development of the WOLED.

As illustrated in FIG. 1 (a), a WOLED employs an organic light-emitting layer 102, the material of which is made up by mixing materials capable of emitting three primary colors of red, green and blue, so that the organic light-emitting layer 102 emits white light. The organic light-emitting layer 102 is disposed between a cathode 101 and an anode 103 so that the white light emitted by the organic light-emitting layer is reflected by the cathode 101 and then exit from a side of the anode 103. In order to improve transmittance and enhance brightness of the WOLED display device, a transflective layer 103' is displaced at one side of the anode corresponding to a region of a color filter of each color to form a microcavity structure between the transflective layer 103' and the cathode. As shown in FIG. 1(b), the microcavity structure refers to a structure formed between a reflective layer and a transflective layer with a thickness of micron scale and the principle of the microcavity structure to increase light intensity is that light rays can be continuously reflected between the reflective layer and the transflective layer, and due to resonance effect, in light finally exiting the transflective layer, light with a specific wavelength will be intensified, and the wavelength of light intensified is related to the thickness of the microcavity structure. In a WOLED display device, different pixel units are used for emitting light of different color, and thus microcavity structures in different pixel units should be able to intensify light of different wavelengths (color of which being the same as the one of the color filter corresponding to the microcavity), that is to say, microcavity structures of different pixel units have different thicknesses.

FIGS. 2 and 3 show diagrams of layer structures of two conventional WOLED array substrates. The color filter is located outside the microcavity structure. Based on the principle mentioned above, microcavity structures corresponding to color filters of each color have different thicknesses, such as the structure 300 in FIG. 2 and the structure 400 in FIG. 3. As lights of different colors have different wavelengths, the corresponding microcavity structures are not the same and have different thicknesses. For example, as shown in FIG. 3, Cathode is the cathode of the OLED, Anode is the anode of the OLED and an organic light emitting layer is disposed therebetween (the material thereof generally formed by mixing organic materials capable of emitting three primary colors RGB). R, G, B and W represent light exiting regions of red light, green light, blue light and white light respectively. Red CF, Green CF and Blue CF are color filters of red light, green light and blue light respectively. Microcavity structure of each color light comprises IZO layer or ITO layer disposed above OC layer (protective layer), further comprises a SiNx and SiOx (silicon nitride and silicon oxide) layer for R region, G region and B region, and further comprises an IZO/ITO layer in addition to the anode for R region and B region, with transmittance of corresponding color light increased after white light emitted by WOLED passes through the layers mentioned above. As shown in FIG. 4, the spot lines correspond to transmittance (i.e. brightness) without microcavity structure, and solid lines correspond to transmittance with microcavity structure. Transmittance of blue light is about 1.6 times of original value, transmittance of green light is about 2.5 times of original value and transmittance of red light is about 2.2 times of original value.

As can be seen from FIGS. 2 and 3, the existing microcavity structure increases light transmittance, however, layer structure of the existing microcavity structure is complicated and it is required to manufacture microcavity structures with different thicknesses for regions corresponding to color filters of each color so that the manufacturing process is complicated.

SUMMARY

The technical problem to be solved by embodiments of present invention is how to obtain the microcavity structure using simple manufacturing process in order to increase transmittance of the WOLED display device.

To solve the above technical problems, embodiments of the present invention provide a method for manufacturing an array substrate comprising following steps:

forming patterns of a thin film transistor structure and a passivation layer on a base substrate to define a pixel region of a pixel unit on the base substrate;

forming patterns of a transflective layer and color filters of various colors in the pixel region, the color filters disposed above the transflective layer;

forming an OLED in the pixel region of the pixel units, the transflective layer and the color filters are disposed between the OLED and the thin film transistor structure.

Forming patterns of the transflective layer and the color filter in the pixel region of the pixel unit includes:

forming a transflective film on the passivation layer;

forming a color filter film of one color on the transflective film, forming a pattern of the color filter of the color in the pixel region through a patterning process, and forming patterns of color filters of other colors sequentially in this manner, therefore forming patterns of the color filters;

etching a portion of the transflective film not covered by the color filter to form a pattern of the transflective layer.

According to an embodiment of the present invention, in the color filters formed, the color filters of different colors have different thicknesses.

According to an embodiment of the present invention, forming the OLED in the pixel region of the plurality of the pixel unit comprising:

forming via holes by etching the passivation layer through a patterning process;

forming a transparent conductive film on the passivation layer, forming a pattern of a first electrode of the OLED through a patterning process, the first electrode being connected to the thin film transistor structure through via holes;

forming an insulation film over the thin film transistor structure, and forming a pattern of a pixel define layer through a patterning process to define a position of the OLED to be formed in the pixel region;

forming an organic light-emitting layer on the pixel define layer and on the first electrode; and forming a second electrode of the OLED on the organic light-emitting layer for reflecting light.

According to an embodiment of the present invention, the method further comprises forming a resin layer on the color filter and on the passivation layer after forming the pattern of the transflective layer and the color filter and before forming the OLED.

According to an embodiment of the present invention, forming the OLED in the pixel region of the pixel unit comprising:

forming via holes through the resin layer and the passivation layer by a patterning process;

forming a transparent conductive film on the resin layer, forming a pattern of a first electrode of the OLED through a patterning process, the first electrode being connected to the thin film transistor structure through the via holes;

forming an insulation film on the thin film transistor structure, forming patterns of a pixel define layer through a patterning process to define a position of the OLED to be formed in the pixel region;

forming an organic light-emitting layer on the pixel define layer and on the first electrode; and forming a second electrode of the OLED on the organic light-emitting layer, and the second electrode used for reflecting light.

According to an embodiment of the present invention, the transflective layer is consisted of any one of silver, aluminum, molybdenum, copper, titanium and chromium and alloys thereof and has a transmittance in a range of 5% to 95%.

According to an embodiment of the present invention, the transflective layer has a thickness in a range of 10 Å to 200 Å.

According to an embodiment of the present invention, the color filter has a thickness in a range of 1000 Å to 40000 Å.

According to another aspect of the present invention, an array substrate manufactured by the methods mentioned above is provided.

Embodiments of the present invention increase light transmittance by forming a color filter on a transflective layer and by forming a microcavity structure between the transflective layer and a reflective electrode (a cathode or an anode) of the OLED. As the color filter is disposed in the microcavity structure for each pixel unit and as the color filters of the pixel units of different colors are to be formed in different steps, thicknesses thereof can be easily controlled separately. Therefore, the array substrate of embodiments of the present invention can be easily to be manufactured at low cost.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
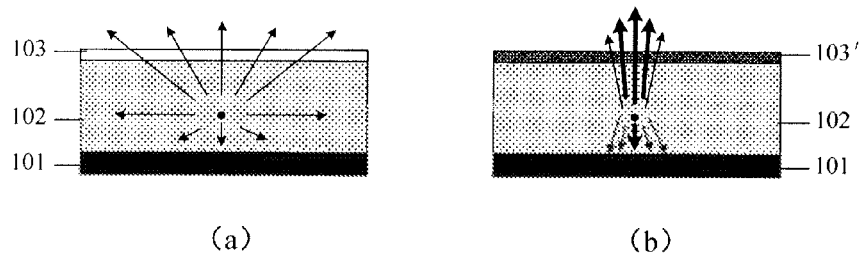
In FIG. 1, (a) is a diagram without microcavity structure, (b) is a diagram of conventional microcavity structure principle.
Figure 2:
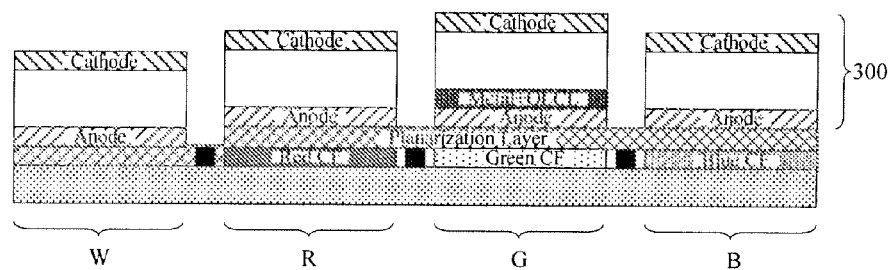
FIG. 2 is a diagram of a WOLED array substrate structure with conventional microcavity structure.
Figure 3:
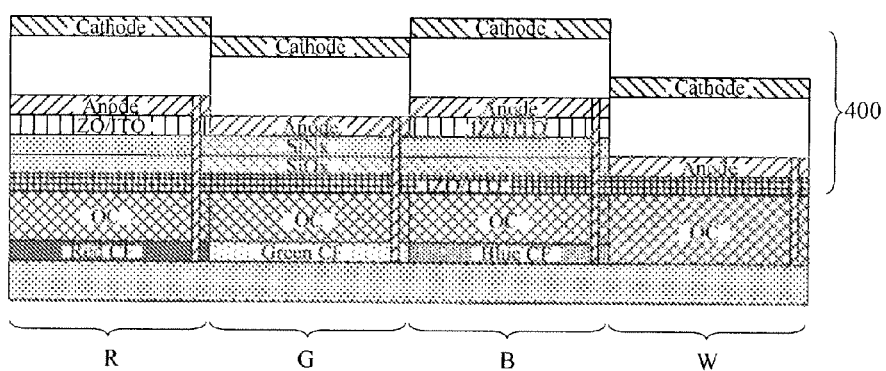
FIG. 3 is a diagram of another WOLED array substrate structure with conventional microcavity structure.
Figure 4:
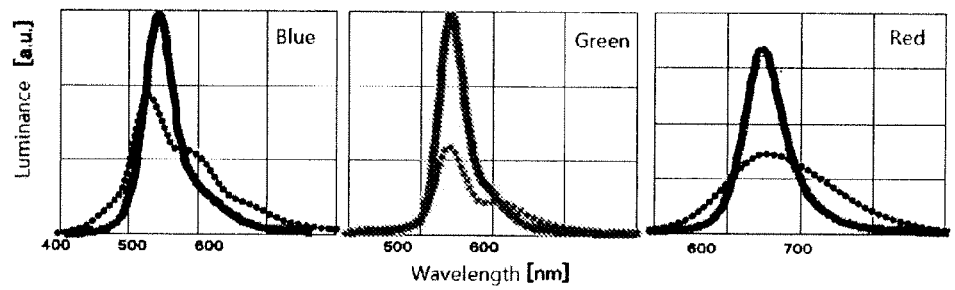
FIG. 4 shows a diagram of a comparing graph of transmittance with and without the microcavity structure.
Figure 5:
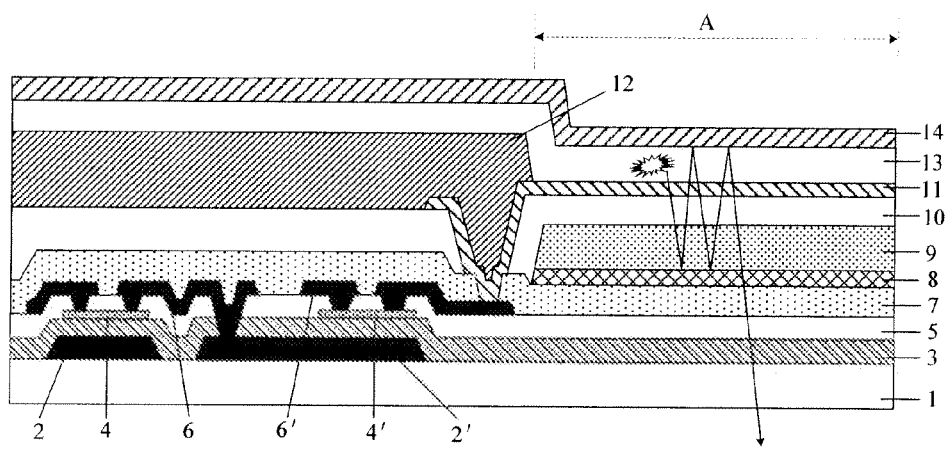
FIG. 5 is a diagram of an array substrate structure according to an embodiment of the present invention.

As illustrated in FIG. 5, an array substrate according to the present embodiment includes: a plurality of gate lines, data lines and pixel units defined by the gate lines and the data lines formed on a base substrate 1. The pixel unit comprises: a thin film transistor structure formed on the base substrate and an OLED driven by the thin film transistor structure, with the OLED disposed in a pixel region of the pixel unit (often referring to a display region outside a region of the thin film transistor), i.e., A region in FIG. 5 (the region outside the A region is the region of thin film transistor). The pixel unit also comprises a color filter 9. The OLED comprises in order in a direction away from the base substrate 1, a first electrode 11 which is transparent, a light-emitting layer 13 and a second electrode 14 for reflecting light.

To realize the microcavity structure, the pixel unit of the array substrate of the present embodiment also comprises a transflective layer 8. The transflective layer 8 is disposed between the OLED and the thin film transistor structure, and the color filter 9 is disposed between the first electrode 11 of the OLED and the transflective layer 8. A microcavity structure is formed between the second electrode 14 of the OLED and the transflective 8, wherein the color filter 9 is located inside the microcavity structure and between the second electrode 14 of the OLED and the transflective layer 8. Therefore, it is possible to adjust the microcavity thickness through controlling the thickness of the color filter 9; as the color filters of the pixel units of different colors is to be formed in different steps, thicknesses thereof may be easily controlled separately, without manufacturing individually other additional layers for pixel of a certain color to control its thickness. Therefore, the array substrate of embodiments of the present invention can be easily manufactured at low cost.

The thin film transistor structure, as shown in FIG. 5, comprises a first gate 2, a second gate 2' and gate lines (not illustrated) formed on the base substrate 1; a gate insulation layer 3 formed over the first gate 2, the second gate 2' and the gate lines; a first active layer 4 and a second active layer 4' formed on the gate insulation layer 3; an insulation layer 5 formed on the first active layer 4 and the second active layer 4'; a first source/drain layer 6 (including a first source and a first drain) and a second/source drain layer 6' (including a second source and a second drain) formed on the insulation layer 5; and a passivation layer 7 formed on the first source drain layer 6 and the second source drain layer 6'. The first gate 2, the gate insulation layer 3, the first active layer 4, the insulation layer 5 and the first source drain layer 6 constitute a switching thin film transistor and the second gate 2', the gate insulation layer 3, the second active layer 4', the insulation layer 5 and the second source drain 6' constitute a driving thin film transistor.

In the present embodiment, the transflective layer 8 is formed on the passivation layer 7 and the color filter 9 is formed on the transflective layer 8. The OLED is disposed over the color filter 9 and is formed in the pixel region A through definition of a pixel define layer (PDL). In the present embodiment, the first electrode 11 is an anode, the second electrode 14 is a cathode (or, the first electrode 11 may be a cathode and the second electrode 14 may be an anode) and the first electrode 11 is connected to the second drain through a via hole in the passivation layer 7. The second electrode 14 may be a reflective electrode made of a reflective material, or may also be a reflective electrode formed by coating a reflective layer on the second electrode 14.

The gate (the first gate 2) of the switching thin film transistor is connected to the gate lines (not illustrated), the source of the switching thin film transistor (the first source) is connected to the data lines (not illustrated), the drain (the first drain) of the switching thin film transistor is connected to the gate (the second gate 2') of the driving thin film transistor, the source (the second source) of the driving thin film transistor is connected to a supply voltage, the drain (the second drain) of the driving thin film transistor is connected to the first electrode 11 of the OLED. White light emitted by the white organic light-emitting layer 13 exits from bottom of the substrate 1 after passing through the first electrode 11 and the underlying layers, as illustrated in FIG. 5. After white light is incident on the transflective layer 8, a portion of the light exits, a portion of the light is reflected, and then the reflected light is reflected by the second electrode 14 again, and light is continuously reflected by the transflective layer 8 and by the second electrode. Due to resonant effect, light of specific wavelength in light finally emitted from the transflective layer 8 will be enhanced, so that transmittance of light with specific wavelength is increased.

To increase the spatial distance of the microcavity structure and further increase transmittance, a resin layer 10 is formed between the color filter 9 and the first electrode 11, and the first electrode 11 is connected to the second drain through a via hole through the passivation layer 7 and the resin layer 10.

In the present embodiment, the transflective layer 8 is made of any one metal of silver, aluminum, molybdenum, copper, titanium, chromium and alloys thereof; the transflective layer 8 has a transmittance in a range of 5% to 95% and has a thickness in a range of 10 Å to 200 Å. The color filter 9 has a thickness within a range of 1000 Å-40000 Å and may be a color filter of RGB mode, RGBY mode or RGBW mode.

Figure 6:
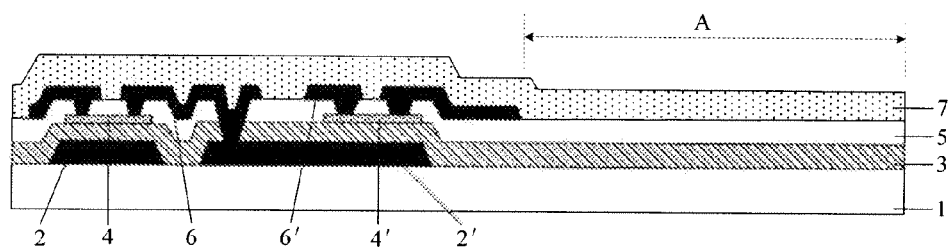
FIG. 6 is a diagram of forming a thin film transistor structure on a base substrate in a process flow for manufacturing the array substrate as shown in FIG. 5.

According to another aspect of the present invention, a method for manufacturing the array substrate mentioned above is provided, the method comprising:

Step S1: forming patterns of a thin film transistor structure and a passivation layer 7 on a base substrate 1 to define a plurality of pixel units on the base substrate 1. The step is performed by forming respective film layers (by means of various manners such as coating, splattering and depositing and the like) and then forming patterns of respective layers by a patterning process (patterning processes normally comprising process such as coating photoresist, exposing, developing, etching, peeling photoresist). The step is substantially the same as that of the existing process for making the array substrate, and will not be elaborated herein. The substrate formed after the step is as shown in FIG. 6 which shows a structure of a pixel unit with the region where the thin film transistor structure is provided being a non-pixel region and the pixel region being A. The thin film transistor structure includes a switching thin film transistor and a driving thin film transistor wherein, the switching thin film transistor includes the first gate 2, the gate insulation layer 3, the first active layer 4, the insulation layer 5 and the first/source drain layer 6 (including the first source and the first drain); the driving thin film transistor includes the second gate 2', the gate insulation layer 3, the second active layer 4', the insulation layer 5 and the second source/drain layer 6' (including the second source and the second drain).

Step S2: patterns of the transflective layer 8 and the color filter 9 are successively formed in the pixel region A of the pixel unit with the color filter 9 disposed on the transflective layer 8. In this step, the color filter 9 can be formed through a patterning process after forming a transflective layer 8 through a patterning process first (one masking needed).

Figure 7:
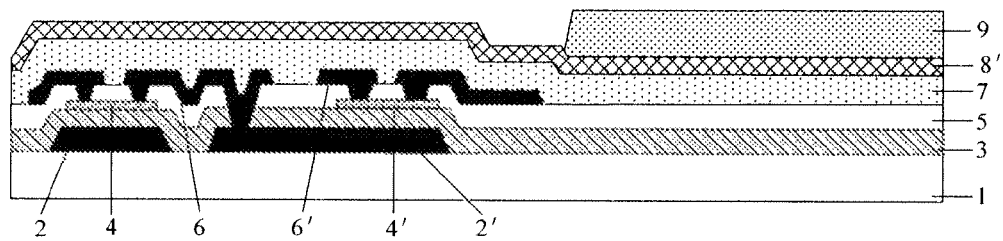
FIG. 7 is a diagram of forming patterns of a transflective layer and a color filter layer on the basis of the structure in FIG. 6.

To save processes, in the present embodiment, patterns of the transflective film 8 and the color filter 9 are formed as below: as shown in FIG. 7, forming a transflective layer 8' on the passivation layer 7, the transflective film 8' made of any one of silver, aluminum, molybdenum, copper, titanium, chromium and alloys thereof and having a thickness within a range of 10 Å to 200 Å and a transmittance within a range of 5%-95%.

The color filter 9 is formed through a plurality of patterning processes (for example, 3 processes for RGB) with each patterning process for forming a pattern of a color filter of one color. The patterns of the color filters 9 are obtained by sequentially forming patterns of other color filters. For example, a color filter of one color is formed on the transflective layer 8 and the pattern of the color filter of this color is formed in the pixel region A by one patterning process. Patterns of the color filters of other colors are formed sequentially in this manner, in order to form patterns of color filters 9 of various colors. When forming a pattern of the color filter of each color, the color filters formed have different thicknesses, so that color filters 9 of different colors finally formed have different thicknesses. For example, the color filter 9 has a thickness within a range of 1000 Å-40000 Å. The color filter has a wide thickness range, as the color filter is provided in the microcavity structure, thickness of the microcavity structure may be controlled through adjusting the thicknesses of the color filter, so that the microcavity structure in each pixel unit enhances light of the same color as that of the color filter 9. As color filters of different colors are formed in different steps, their thicknesses can be easily controlled separately and there is no need to make additional layers to control thickness of a pixel unit of a certain color individually. Therefore, the array substrate of the embodiments of the present invention can be easily manufactured at a low cost. The substrate formed with the color filter 9 is shown in FIG. 7 wherein the color filter 9 located in the pixel region A and covering the transflective film 8'.

Figure 8:
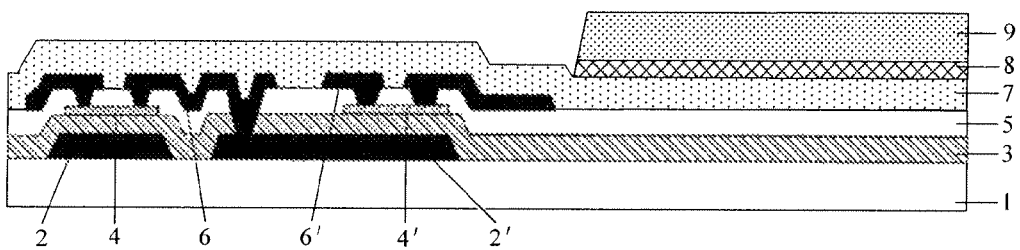
FIG. 8 is a structural diagram of forming patterns of a color filter on the basis of the structure in FIG. 7.

As illustrated in FIG. 8, a portion of the transflective film 8' not covered by the color filter 9 is removed through etching after the color filter 9 is formed, to form a pattern of the transflective layer 8. Since the color filter 9 is used as a mask for patterning the transflective layer 8, manufacturing process is saved.

Figure 9:
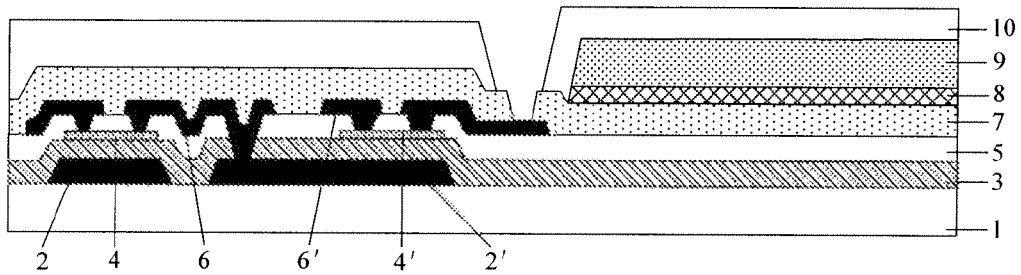
FIG. 9 is a structural diagram of forming patterns of a resin layer on the basis of the structure in FIG. 8.

Step S3: forming an OLED in the pixel region A of the pixel units, the transflective layer 8 and the color filter 9 disposed between the OLED and the film transistor structure. The step comprises:

Forming via holes by etching the passivation layer 7 through a patterning process, as shown in FIG. 9. To increase the spatial distance of the microcavity structure and further increase transmittance, it is also possible to form the resin layer 10 on the passivation layer 7, and the via holes go through the passivation layer 7 and the resin layer 10.

Figure 10:
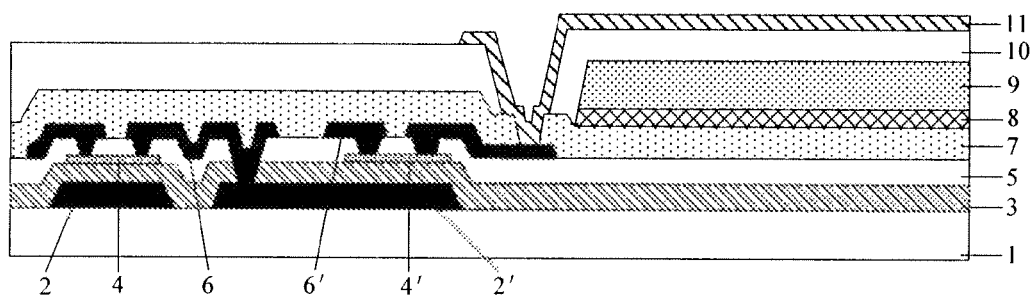
FIG. 10 is a structural diagram of forming anode on the basis of the structure in FIG. 9.

As shown in FIG. 10, a transparent conductive film is formed on the resin layer 10, a pattern of the first electrode 11 of the OLED are formed through a patterning process, so that the first electrode 11 is connected to the thin film transistor structure through the via holes, that is, connected to the drain of the driving thin film transistor. In the situation that a resin layer is not formed, the transparent conductive film is formed on the layer of color filter 9.

Figure 11:
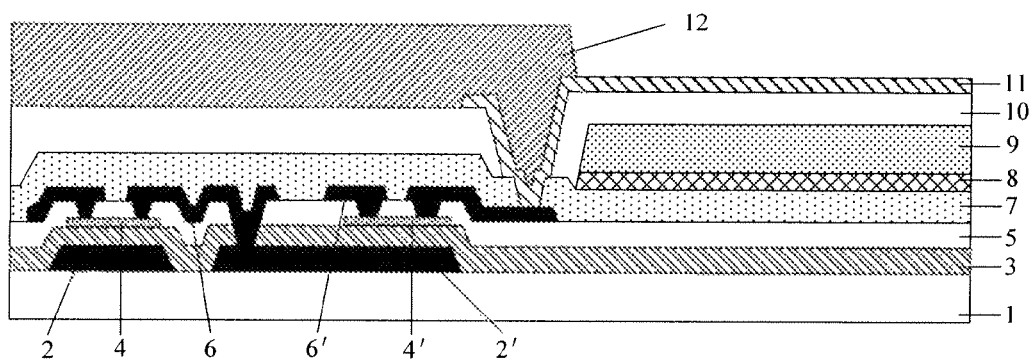
FIG. 11 is a structural diagram of forming a pattern of a pixel define layer on the basis of the structure in FIG. 10.

As shown in FIG. 11, an insulation film is formed, a pattern of the pixel define layer 12 is formed through a patterning process, so that position of the OLED to be formed is defined in the pixel region A.

The organic light-emitting layer 13 and the second electrode 14 of the OLED are formed so that the OLED is formed and the array substrate finally formed is as shown in FIG. 5. The second electrode 14 can be a reflective electrode formed of reflective materials. Or, a reflective layer can be formed on the organic light-emitting layer 13, and then the second electrode can be formed on the reflective layer. Or, the second electrode 14 can be formed on the organic light-emitting layer 13 and a reflective layer is formed on the second electrode 14.

The foregoing are merely exemplary embodiments of the invention, but are not used to limit the protection scope of the invention. The protection scope of the invention shall be defined by the attached claims.

The invention claimed is:

1. A method for manufacturing an array substrate comprising:
    forming patterns of a thin film transistor structure and a passivation layer on a base substrate to define a pixel region of a pixel unit on the base substrate;
    forming patterns of a transflective layer and a color filter in a pixel region of the pixel unit, the color filter disposed over the transflective layer; and
    forming an organic light-emitting diode in the pixel region of the pixel unit, wherein the transflective layer and the color filter are disposed between the organic light-emitting diode and the thin film transistor structure, and
    wherein the transflective layer is both physically and electrically separated from a pixel electrode of the organic light-emitting diode, the pixel electrode being electrically connected to the thin film transistor structure in the pixel region of the pixel unit.

2. The method according to claim 1, wherein forming patterns of the transflective layer and the color filter in the pixel region of the pixel unit comprising:
    forming a transflective film on the passivation layer;
    forming a color filter film of one color on the transflective film, forming patterns of a color filter of the color in the pixel region through a patterning process, and forming patterns of color filters of other colors sequentially in this manner, so that patterns of the color filters is formed; and
    etching a portion of the transflective film not covered by the color filter to form patterns of the transflective layer.

3. The method according to claim 2, wherein, in the formed color filters, the color filters of different colors have different thicknesses.

4. The method according to claim 1, wherein, forming the organic light-emitting diode in the pixel region of the pixel unit comprising:
    forming via holes on the passivation layer by etching through a patterning process;
    forming a transparent conductive film on the passivation layer, and forming a pattern of a first electrode of the organic light-emitting diode through a patterning process, the first electrode being connected to the thin film transistor structure through via holes;
    forming an insulation film over the thin film transistor structure, and forming a pattern of a pixel define layer through a patterning process to define a position of the organic light-emitting diode to be formed in the pixel region;
    forming an organic light-emitting layer on the pixel define layer and on the first electrode; and
    forming a second electrode of the organic light-emitting diode on the organic light-emitting layer for reflecting light.

5. The method according to claim 1, wherein a resin layer is formed on the color filter and on the passivation layer after forming patterns of the transflective layer and the color filter and before forming the organic light-emitting diode.

6. The method according to claim 5, wherein, forming the organic light-emitting diode in the pixel region of the pixel unit comprising:
    forming via holes penetrating the resin layer and the passivation layer through a patterning process; forming a transparent conductive film on the resin layer and forming a pattern of a first electrode of the organic light-emitting diode through a patterning process, the first electrode being connected to the thin film transistor structure through the via holes;
    forming an insulation film on the thin film transistor structure, forming a pattern of a pixel define layer through a patterning process to define a position of the organic light-emitting diode to be formed in the pixel region;
    forming an organic light-emitting layer on the pixel define layer and on the first electrode; and
    forming a second electrode of the organic light-emitting diode on the organic light-emitting layer, the second electrode used for reflecting light.

7. The method according to claim 1, wherein the transflective layer is made of any one of silver, aluminum, molybdenum, copper, titanium and chromium and alloys thereof and has a transmittance in a range of 5% to 95%.

8. The method according to claim 1, wherein the transflective layer has a thickness in a range of 10 Å to 200 Å.

9. The method according to claim 1, wherein the color filter has a thickness in a range of 1000 Å to 40000 Å.

10. An array substrate formed with the method according to claim 1.

* * * * *